United States Patent
Huang

(10) Patent No.: US 10,454,065 B1
(45) Date of Patent: Oct. 22, 2019

(54) OLED DEVICE ENCAPSULATING METHOD AND STRUCTURE, OLED DEVICE, AND DISPLAY SCREEN

(71) Applicant: Shenzhen China Star Optoelectronics Technology Co., Ltd, Shenzhen, Guangdong (CN)

(72) Inventor: Hui Huang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 16/439,658

(22) Filed: Jun. 12, 2019

Related U.S. Application Data

(62) Division of application No. 15/563,645, filed on Oct. 2, 2017, now Pat. No. 10,361,394.

(51) Int. Cl.
*H01L 51/52* (2006.01)
*H01L 51/56* (2006.01)
*H01L 33/08* (2010.01)
*H01L 51/00* (2006.01)

(52) U.S. Cl.
CPC ...... *H01L 51/5253* (2013.01); *H01L 51/0005* (2013.01); *H01L 51/524* (2013.01)

(58) Field of Classification Search
CPC ............ H01L 51/5253; H01L 51/0005; H01L 51/524
USPC ........................................................ 257/40
See application file for complete search history.

(56) References Cited

U.S. PATENT DOCUMENTS

| | | | | |
|---|---|---|---|---|
| 8,995,022 | B1* | 3/2015 | Vronsky | H01L 51/0005 358/3.06 |
| 2003/0170496 | A1* | 9/2003 | Hieda | H01L 51/524 428/690 |
| 2004/0164671 | A1* | 8/2004 | Noguchi | H01L 51/5036 313/504 |
| 2005/0239295 | A1* | 10/2005 | Wang | G02B 6/138 438/780 |
| 2006/0019034 | A1 | 1/2006 | Toyoda | |
| 2007/0176549 | A1* | 8/2007 | Park | C03C 8/02 313/512 |
| 2007/0232182 | A1* | 10/2007 | Park | H01L 51/525 445/25 |
| 2008/0218066 | A1* | 9/2008 | Kim | H01L 51/524 313/504 |
| 2010/0109516 | A1* | 5/2010 | Warashina | H01L 51/5243 313/504 |

(Continued)

FOREIGN PATENT DOCUMENTS

| | | |
|---|---|---|
| CN | 101348048 A | 1/2009 |
| CN | 101373816 A | 2/2009 |

(Continued)

*Primary Examiner* — Sheikh Maruf
(74) *Attorney, Agent, or Firm* — Andrew C. Cheng

(57) ABSTRACT

A display screen includes an OLED device encapsulating structure that encapsulates an OLED. The OLED device encapsulating structure includes a substrate, a barrier layer formed on the substrate, a surface active layer disposed on the barrier layer, and a buffer layer stacked on the surface active layer. An orthogonal projection of the buffer layer on the barrier layer is coincident with that of the surface active layer on the barrier layer. A composite layer may be further stacked on the buffer.

7 Claims, 2 Drawing Sheets

(56) References Cited

U.S. PATENT DOCUMENTS

| | | | | |
|---|---|---|---|---|
| 2011/0121356 | A1* | 5/2011 | Krawinkel | C03C 27/10 |
| | | | | 257/100 |
| 2012/0305981 | A1* | 12/2012 | Park | H01L 51/5253 |
| | | | | 257/100 |
| 2012/0318023 | A1* | 12/2012 | Shimomura | C03C 27/06 |
| | | | | 65/43 |
| 2013/0240848 | A1* | 9/2013 | Lin | H01L 51/52 |
| | | | | 257/40 |
| 2015/0356926 | A1* | 12/2015 | Bae | H01L 51/5253 |
| | | | | 345/212 |

FOREIGN PATENT DOCUMENTS

| | | |
|---|---|---|
| CN | 102736414 A | 10/2012 |
| CN | 105355647 A | 2/2016 |
| CN | 105977394 A | 9/2016 |
| CN | 106654042 A | 5/2017 |
| CN | 106711354 A | 5/2017 |
| KR | 20070060973 A | 6/2007 |

\* cited by examiner

OLED DEVICE ENCAPSULATING METHOD AND STRUCTURE, OLED DEVICE, AND DISPLAY SCREEN

CROSS REFERENCE TO RELATED APPLICATIONS

This is a divisional application of co-pending U.S. Patent Application Ser. No. 15/563,645 filed on Oct. 2, 2017, which is a national phase of PCT Application PCT/CN2017/094551 filed on Jul. 26, 2017, claiming foreign priority of Chinese Patent Application No. 201710471250.7 filed on Jun. 20, 2017, the disclosure of which is incorporated herein by reference in its entirety.

TECHNICAL FIELD

The present disclosure relates to display technology, and more particularly relates to an OLED device encapsulating method, an OLED device encapsulating structure, an OLED device, and a display screen.

BACKGROUND

In the current lighting and display field, an organic light-emitting diode (OLED) (also known as organic optoelectronic display) features a low starting voltage, thinness, lightweight, self-luminous etc. and has by virtue of these received increasing and extensive study for development of lighting products and the panel industry to meet the demands for low energy consumption, thinness, lightweight, and surface light source.

OLED devices are extremely sensitive to water and oxygen. In current OLED thin-film encapsulating, the common technology is depositing alternately a polymer organic thin-film and an inorganic thin-film onto the OLED so that the OLED could be encapsulated by stacks of several layers. To achieve better buffering effects, a buffer layer is formed using inkjet printing. But there exists a gap among the inkjet printing heads, the time required for film-forming encapsulating is lengthened and the encapsulating cost is increased.

SUMMARY

It is an object of the disclosure to provide an OLED device encapsulating method and an OLED device encapsulating structure, which can shorten the film-forming time and reduce the cost.

An OLED device and a display screen are also provided.

The OLED device encapsulating structure of the disclosure is used to encapsulate the OLED layer, and includes a substrate, a barrier layer formed on the substrate, a surface active layer disposed on the barrier layer, and a buffer layer stacked on the surface active layer. An orthogonal projection of the buffer layer onto the barrier layer may align and coincide with that of the surface active layer onto the barrier layer. A composite layer may further be stacked on the buffer layer.

The surface active layer material may be one of a hydrophilic polymer active material, polyol based salt, or polyol based ethers.

The surface active layer may be formed by inkjet printing.

The composite layer may include a first barrier layer and a first buffer layer stacked on the first barrier layer, or alternatively a plurality of first barrier layers and a first buffer layer sandwiched between every two first barrier layers. The first one of the plurality of first barrier layers may be in contact with the buffer layer.

The OLED device encapsulating method of this disclosure is used to encapsulate an OLED. The method includes the follows.

A substrate that covers the OLED is provided and a barrier layer is formed on the substrate.

A surface active layer composed of a plurality of strips arranged in the form of a matrix is formed on the barrier layer by inkjet printing.

Buffer strips in one-to-one correspondence with the plurality of strips are sprayed on the surface active layer.

The corresponding buffer strips of the plurality of strips are left standing to diffuse and overspread the substrate and further cover the barrier layer, to form a buffer layer.

The surface active layer may have a thickness in the range of less than 100 microns.

The surface active layer material may be one of a hydrophilic polymer active material, polyol based salt, or polyol based ethers.

The OLED device encapsulating method may further include the follows. The substrate is heated to remove the surface active layer.

The OLED device according to the disclosure may include the OLED device encapsulating structure.

The display screen according to the disclosure may include the OLED device.

According to the OLED device encapsulating method of the disclosure, the surface active layer is formed on the barrier layer, and then the buffer material is sprayed to diffuse and cover the entire barrier layer before the buffer layer is formed, through the chemical reaction of the surface active layer and the buffer material. Thus, the film-forming time is shortened and the cost is reduced.

BRIEF DESCRIPTION OF THE DRAWINGS

In order to better illustrate the technical solutions embodied by the embodiments of the disclosure or by the prior art, the accompanying drawings for use with description of the embodiments or the prior art are briefly described below. It will be apparent that the drawings described in the following represent merely some embodiments of the disclosure, and that those of ordinary skill in the art will be able to obtain other drawings from these drawings without performing any creative work.

DETAILED DESCRIPTION OF ILLUSTRATED EMBODIMENTS

Hereinafter, technical solutions embodied by the embodiments of the disclosure will be described in a clear and comprehensive manner in reference to the accompanying drawings intended for the embodiments. It is evident that the embodiments described herein constitute merely some rather than all of the embodiments of the disclosure, and that those of ordinary skill in the art will be able to derive other embodiments based on these embodiments without making inventive efforts, which all such derived embodiments shall all fall in the protection scope of the disclosure.

Figure 1:
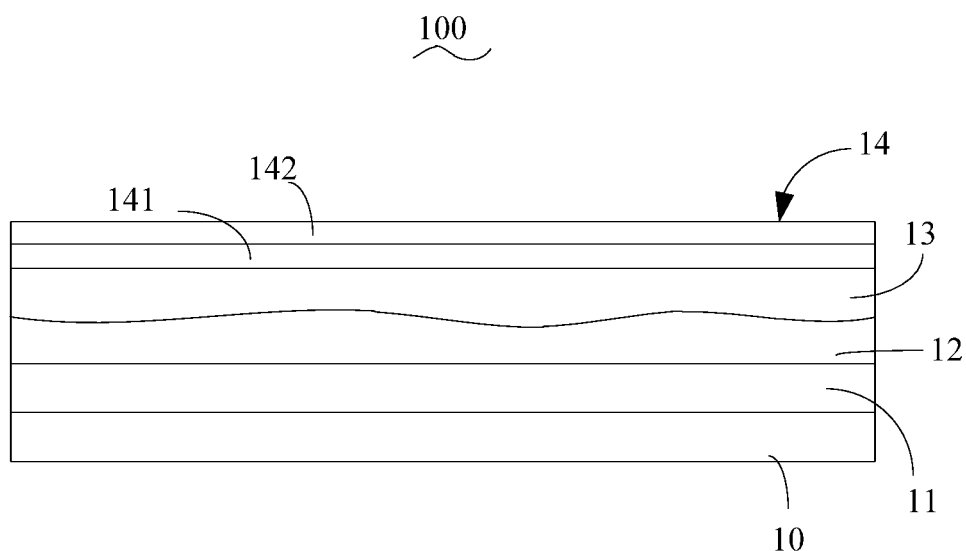
FIG. 1 is a schematic diagram of an OLED device encapsulating structure according to an embodiment of the disclosure.

Referring to FIG. 1, an exemplary embodiment of the disclosure provides an OLED device encapsulating structure 100, used to encapsulate an OLED layer. OLED device encapsulating structure 100 may include a substrate 10, a barrier layer 11 formed on substrate 10, a surface active layer 12 disposed on barrier layer 11, and a buffer layer 13 stacked on surface active layer 12. An orthogonal projection of buffer layer 13 onto barrier layer 11 may align and coincide with that of surface active layer 12 onto barrier layer 11. In this embodiment, surface active layer 12 material may be one of a hydrophilic polymer active material, polyol based salt, or polyol based ethers. As long as surface active layer 12 material has a free hydroxyl group or H+ that can create a hydrogen bond with the hydroxyl group and H+ of buffer layer 13 to enhance their bonding ability, this material will suffice the purpose of the disclosure. That is, after being sprayed, the buffer material could be diffused by bonding with surface active layer 12 thus forming buffer layer 13.

If the temperature of the OLED device encapsulating structure is increased by heating in its manufacturing process, or the OLED device is able to gain sufficient temperature in use, then surface active layer 12 will volatilize, without affecting the encapsulating effect. In this embodiment, surface active layer 12 is formed by inkjet printing.

A composite layer 14 may further be stacked onto buffer layer 13. In this embodiment, composite layer 14 includes a first barrier layer 141 and a first buffer layer 142 stacked on first barrier layer 141. Barrier layer 11 and first barrier layer 141 may be made of an inorganic material. Buffer layer 13 and first buffer layer 142 may be of an organic material.

Figure 2:
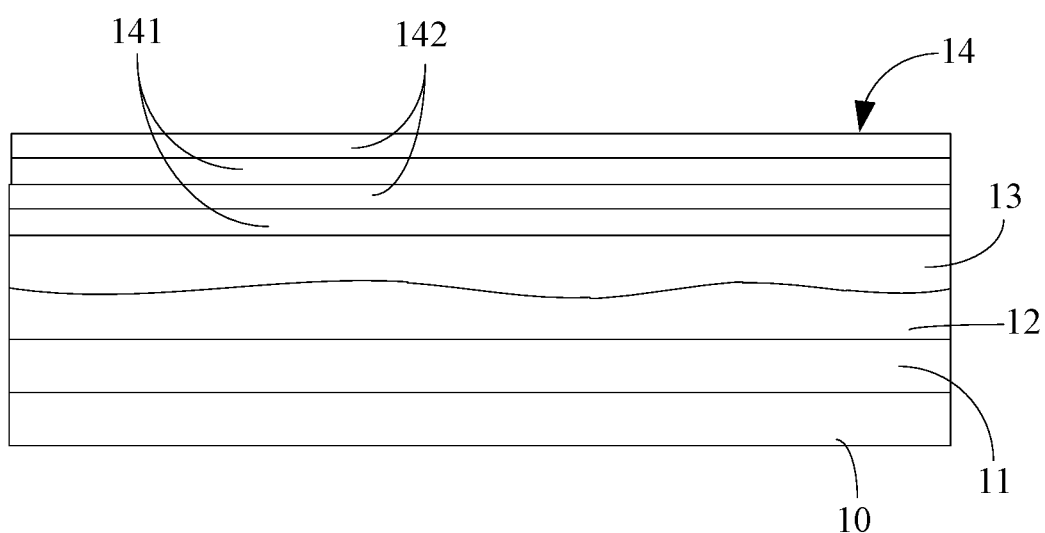
FIG. 2 is a schematic diagram of an OLED device encapsulating structure according to another embodiment of the disclosure.

Referring now to FIG. 2, composite layer 14 may alternatively include a plurality of first barrier layers 141 and a first buffer layer 142 sandwiched between every two first barrier layers 141. The first one of the plurality of first barrier layers 141 may be in contact with buffer layer 13. According to actual requirements, a thin-film encapsulating layer of an alternate organic layer and inorganic layer structure can be deposited on the substrate to effect the insulation from water and oxygen and effectively extend the folding and curling lifetime.

Figure 3:
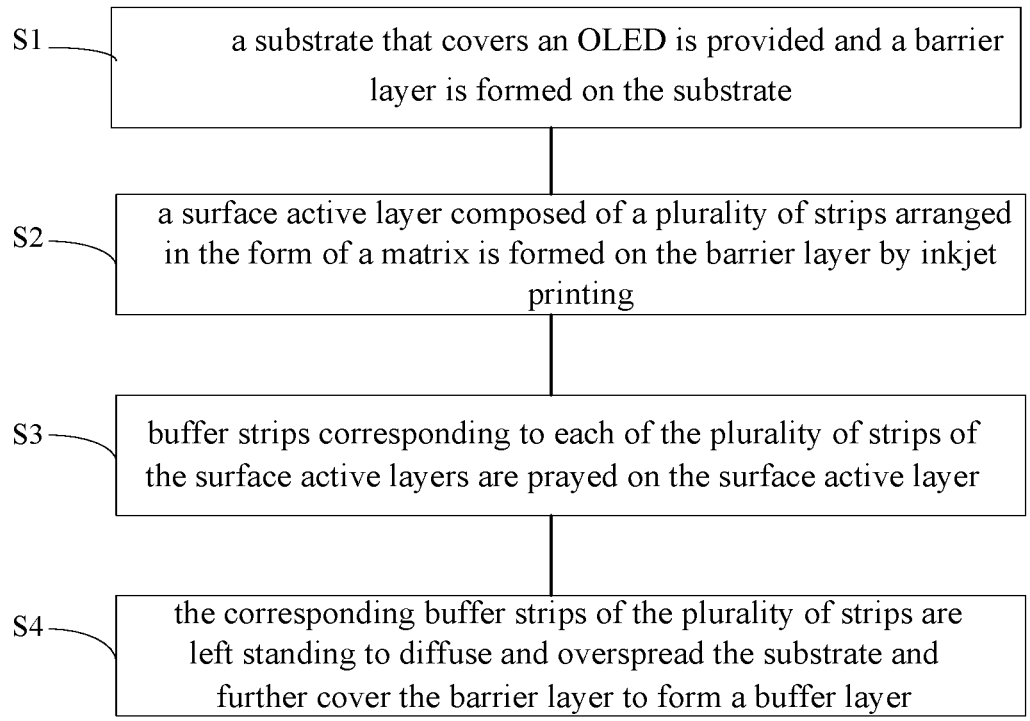
FIG. 3 shows a flow chart of an OLED device encapsulating method according to an embodiment of the disclosure.

Referring now to FIG. 3, the OLED device encapsulating method provided by the disclosure is used to encapsulate an OLED layer and may include the following steps.

In S1, referring also to FIG. 1, a substrate 10 is provided that covers the OLED and a barrier layer 11 is then formed on the substrate 10. Barrier layer 11 may be formed by vacuum deposition.

Figure 4:
FIG. 4 is a schematic diagram of forming the surface active layer in the OLED device encapsulating method according to an embodiment of the disclosure.

In S2, referring also to FIG. 4, inkjet printing may be used to form on barrier layer 11 a surface active layer 12 that may be composed of a plurality of strips 120 arranged in the form of a matrix. Surface active layer 12 may have a thickness in the range of less than 100 microns. Surface active layer 12 material may be one of a hydrophilic polymer active material, polyol based salt, or polyol based ethers. Specifically, surface active layer 12 may be formed by inkjet printing as a plurality of strips arranged on the surface and evenly spaced from each other.

In S3, buffer strips 131 that are in one-to-one correspondence with the plurality of strips of the surface active layer is sprayed onto surface active layer 12. Buffer strips 131 may be formed by inkjet printing, formation (such as manner or path) of the buffer strips may be the same as the surface active layer 12 is formed.

In S4, the corresponding buffer strips 131 of the plurality of strips, after standing, may overspread the substrate by diffusion and cover the barrier layer, to form a buffer layer 13.

The inkjet-printed buffer material generally overspreads the entire device in a static leveling manner, to achieve the purpose of covering and encapsulating. By comparison, in this disclosure surface active layer 12 is first firmed on the barrier layer and then the buffer material is sprayed so that the buffer material will diffuse and spread over the entire barrier layer to form buffer layer 13 through the chemical reaction of surface active layer 12 and the buffer material, thus shortening the film-forming time and reducing the cost.

The method may further include a step S5 in which a composite layer 14 is formed on buffer layer 13. Specifically, a first barrier layer may be deposited onto the barrier layer, and a first buffer layer may then be deposited onto the first barrier layer.

In this embodiment, barrier layer 11 may be made of an inorganic material, including but not limited to, $Al_2O_3$, $SiN_x$, $TiO_2$, $SiO_x$, which may be used to form the barrier layer using a method including but not limited to plasma enhanced chemical vapor deposition (PECVD).

Buffer layer 13 may be of a polymeric material, including, but not limited to, Plasma Polymerized HMDSO (pp-HMDSO (Hexamethyl-dimethyl silyl (HMDSO)), polyacrylates, polycarbonates, polystyrenes and other transparent polymers, which may be used to form a stress layer to alleviate the stress in the barrier layer.

Figure 5:
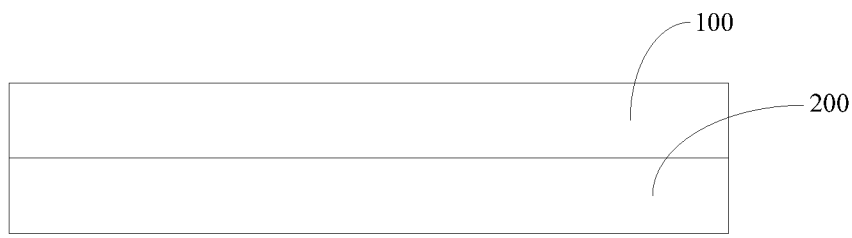
FIG. 5 is a schematic diagram of an OLED device according to an embodiment of the disclosure.

Referring now to FIG. 5, an OLED device is provided that includes OLED device encapsulating structure 100 and an OLED 200. Adopting the encapsulating structure described above, the OLED can save the encapsulating cost. A display incorporating the OLED device is further provided.

While the disclosure has been described above in detail in reference to some exemplary embodiments, the scope of the disclosure is not limited thereto. As will occur to those of ordinary skill in the art that all or part of the embodiments described above as well as the equivalent substitutes of the appended claims shall all fall in the scope of the disclosure.

What is claimed is:

1. A display screen, comprising an organic light emitting diode (OLED) device:
    wherein the OLED device comprises an OLED device encapsulating structure, which is configured to encapsulate an OLED;
    wherein the OLED device encapsulating structure comprises:
    a substrate;
    a barrier layer formed on the substrate;
    a surface active layer disposed on the barrier layer;
    a buffer layer stacked on the surface active layer, an orthogonal projection of the buffer layer onto the barrier layer coinciding with that of the surface active layer onto the barrier layer; and
    a composite layer stacked on the buffer layer;
    wherein the surface active layer is sandwiched between and in direct contact with the barrier layer and the buffer layer and the surface active layer is a material that creates a hydrogen bond with a material of the buffer layer to enhance bonding therebetween.

2. The display screen according to claim 1, wherein the material of the surface active layer is of one of a hydrophilic polymer active material, polyol based salt, and polyol based ethers.

3. The display screen according to claim 2, wherein the surface active layer is formed by inkjet printing.

4. The display screen according to claim 1, wherein the composite layer comprises a first barrier layer and a first buffer layer stacked on the first barrier layer, or a plurality of first barrier layers and a first buffer layer sandwiched between every two first barrier layers, a first one of the plurality of first barrier layers contacting the buffer layer.

5. The display screen according to claim 4, wherein the barrier layer and the first barrier layer are made of an inorganic material.

6. The display screen according to claim 4, wherein the buffer layer and the first buffer layer are made of an organic material.

7. The display screen according to claim 1, wherein the buffer layer is made of a polymeric material.

\* \* \* \* \*